(12) United States Patent
Kim

(10) Patent No.: US 12,249,613 B2
(45) Date of Patent: Mar. 11, 2025

(54) IMAGE SENSING DEVICE

(71) Applicant: SK hynix Inc., Icheon-si (KR)

(72) Inventor: Dong Ha Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 807 days.

(21) Appl. No.: 17/387,272

(22) Filed: Jul. 28, 2021

(65) Prior Publication Data

US 2022/0190020 A1 Jun. 16, 2022

(30) Foreign Application Priority Data

Dec. 15, 2020 (KR) .................. 10-2020-0175696

(51) Int. Cl.
*H01L 27/146* (2006.01)

(52) U.S. Cl.
CPC .. *H01L 27/14623* (2013.01); *H01L 27/14629* (2013.01); *H01L 27/14621* (2013.01)

(58) Field of Classification Search
CPC ......... H01L 27/14645; H01L 27/14629; H01L 27/1463; H01L 27/14621; H01L 27/14627; H01L 27/14623; H04N 25/585; H04N 25/581
See application file for complete search history.

(56) References Cited

U.S. PATENT DOCUMENTS

| | | | |
|---|---|---|---|
| 2015/0155322 A1* | 6/2015 | Ting | H01L 27/14629 257/443 |
| 2018/0286897 A1 | 10/2018 | Watanabe et al. | |
| 2019/0157329 A1* | 5/2019 | Kim | H01L 27/1464 |
| 2022/0173138 A1* | 6/2022 | Yang | H01L 27/1463 |

FOREIGN PATENT DOCUMENTS

| | | |
|---|---|---|
| KR | 20190057601 A | 5/2019 |
| KR | 20200013939 A | 2/2020 |
| KR | 10-2020-0082333 A | 7/2020 |

OTHER PUBLICATIONS

Request for the Submission of an Opinion for KR Appl. No. 10-2020-0175696, mailed on Jan. 15, 2025, 13 pages with English translation.

* cited by examiner

*Primary Examiner* — Alia Sabur
(74) *Attorney, Agent, or Firm* — Perkins Coie LLP

(57) ABSTRACT

An image sensing device may include: one or more first unit pixels structured to generate a pixel signal by converting light incident through a first color filter; a plurality of second unit pixels positioned adjacent to the first unit pixel, and structured to generate a pixel signal by converting light incident through a second color filter; a first grid including a light absorption layer positioned between the first and second color filters; and a second grid including a light reflecting layer positioned between adjacent second color filters.

18 Claims, 15 Drawing Sheets

IMAGE SENSING DEVICE

CROSS-REFERENCES TO RELATED APPLICATION

The patent document claims the priority and benefits of Korean patent application No. 10-2020-0175696, filed on Dec. 15, 2020, which is incorporated by reference in its entirety as part of the disclosure of this patent document.

TECHNICAL FIELD

The technology and implementations disclosed in this patent document generally relate to an image sensing device.

BACKGROUND

An image sensor is a device for capturing optical images by converting light into electrical signals using a photosensitive semiconductor material which reacts to light. With the recent development of automotive, medical, computer and communication industries, the demand for high-performance image sensors is increasing in various fields such as smart phones, digital cameras, camcorders, personal communication systems (PCSs), video game consoles, IoT (Internet of Things), robots, surveillance cameras, medical micro cameras, etc.

SUMMARY

The embodiments of the disclosed technology relate to an image sensing device including a grid structure that can acquire both a short exposure pixel signal and a normal pixel signal only through one exposure.

In an embodiment, an image sensing device may include: one or more first unit pixels structured to generate a pixel signal by converting light incident through a first color filter; a plurality of second unit pixels positioned adjacent to the first unit pixel, and structured to generate a pixel signal by converting light incident through a second color filter; a first grid including a light absorption layer positioned between the first and second color filters; and a second grid including a light reflecting layer positioned between adjacent second color filters.

In an embodiment, an image sensing device may include: a plurality of color filters arranged in rows and columns; and a grid structure positioned between adjacent color filters, wherein the plurality of color filters include one or more first color filters and one or more second color filters, and wherein the grid structure includes a first grid including a light absorption layer positioned adjacent to the one or more first color filters; and a second grid including a light reflecting layer positioned spaced apart from the first color filter and adjacent to the one or more second color filters.

In an embodiment, an image sensing device may include: one or more first unit pixels configured to generate a pixel signal by converting light incident through a first color filter; a plurality of second unit pixels positioned adjacent to the first unit pixel, and each configured to generate a pixel signal by converting light incident through a second color filter; a first grid positioned between the first and second color filters so as to prevent cross-talk between the first and second color filters, and including a light absorption layer; and a second grid positioned between the second color filters so as to prevent cross-talk between the second color filters, and including a light reflecting layer.

In an embodiment, an image sensing device may include: a plurality of color filters arranged adjacent to each other; and a grid structure positioned between the color filters so as to be adjacent to the color filters, wherein the grid structure includes: a first grid positioned adjacent to one or more first color filters among the plurality of color filters, and including a light absorption layer; and a second grid positioned so as not to be adjacent to the first color filter, but to be adjacent to the second color filters other than the first color filter among the plurality of color filters, and including a light reflecting layer.

In some embodiments of the disclosed technology, the image sensing device can acquire both a short exposure pixel signal and a normal pixel signal only through one exposure

DETAILED DESCRIPTION

Hereafter, various embodiments will be described with reference to the accompanying drawings. However, it should be understood that the present disclosure is not limited to specific embodiments, but includes various modifications, equivalents and/or alternatives of the embodiments. The embodiments of the present disclosure may provide a variety of effects capable of being directly or indirectly recognized through the present disclosure.

Figure 1:
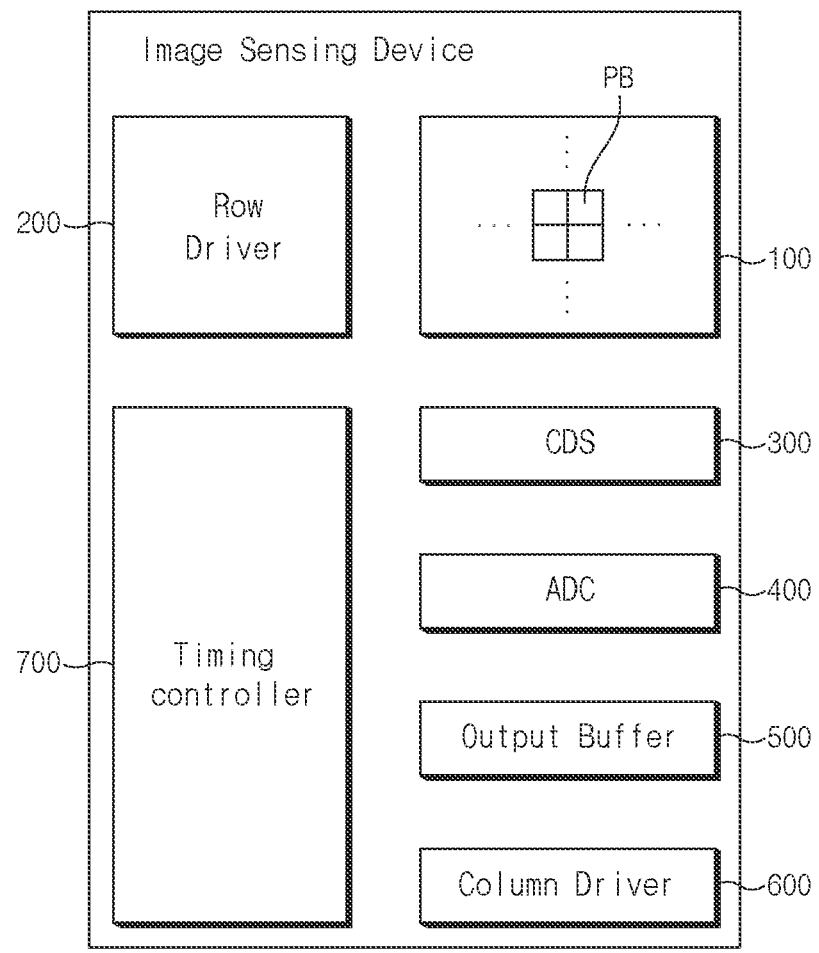
FIG. 1 is a block diagram illustrating an example of an image sensing device based on some embodiments of the disclosed technology.

FIG. 1 is a block diagram illustrating an example of an image sensing device based on some embodiments of the disclosed technology.

Referring to FIG. 1, the image sensing device may include a pixel array 100, a row driver 200, a CDS (Correlated Double Coupler) 300, an ADC (Analog Digital Converter) 400, an output buffer 500, a column driver 600 and a timing controller 700.

The pixel array 100 may include a plurality of sub pixel blocks PB which are successively arranged in row and column directions. Each of the sub pixel blocks PB may include a plurality of unit pixels each configured to generate an electrical signal (pixel signal) corresponding to incident light by converting the incident light. Each of the sub pixel blocks PB may have a structure in which a plurality of unit pixels having the same color filters are arranged adjacent to each other in an N×N matrix where N is a natural number greater than or equal to 2. The color filters may include red color filters, green color filters and blue color filters.

The pixel array 100 may receive driving signals, such as a row selection signal, a reset signal and a transmission signal, from the row driver 200. When the driving signal is received, each of the unit pixels may be enabled to perform an operation corresponding to the row selection signal, the reset signal or the transmission signal.

The row driver 200 may operate the unit pixels based on control signals provided from a control circuit such as the timing controller 700. The row driver 200 may select one or more unit pixels coupled to one or more row lines of the pixel array 100. The row driver 200 may generate a row selection signal for selecting at least one row line among a plurality of row lines. The row driver 200 may sequentially enable the reset signals and the transmission signals for the unit pixels of the selected row line. Pixel signals generated by the unit pixels of the selected row line may be outputted to the CDS 300.

The CDS 300 may remove undesired offset values of the unit pixels by using a CDS method. For example, the CDS 300 may compare output voltages of the unit pixels, which are acquired after and before photocharges generated by incident light are accumulated in a sensing node (floating diffusion node), in order to remove the undesired offset values of the unit pixels. Through this operation, it is possible to acquire a pixel signal generated only by incident light without noise components. The CDS 300 may sequentially sample and hold the voltage level of a reference signal and the voltage levels of the pixel signals received from the pixel array 100 through the plurality of column lines, based on a clock signal provided from the timing controller 700. The CDS 300 may output the reference signal and a pixel signal as a CDS signal to the ADC 400.

The ADC 400 may convert the CDS signal, received from the CDS 300, into a digital signal. The ADC 400 may include a ramp-comparison type ADC. The ADC 400 may generate a comparison signal by comparing a ramp signal provided from the timing controller 700 to the CDS signal provided from the CDS 300. The ADC 400 may count the level transition time of the comparison signal based on the ramp signal provided from the timing controller 700, and output the count value to the output buffer 500.

The output buffer 500 may temporarily store column-based data provided from the ADC 400, under control of the timing controller 700. The output buffer 500 may operate as an interface for compensating for a difference in transmission (or processing) speed between the image sensing device and another device coupled thereto.

The column driver 600 may select a column of the output buffer 500 and sequentially output data which are temporarily stored in the selected column of the output buffer 500, under control of the timing controller 700. When an address signal is received from the timing controller 700, the column driver 600 may generate a column selection signal based on the address signal, and select a column of the output buffer 500, such that image data from the selected column of the output buffer 500 is outputted as an output signal.

The timing controller 700 may generate signals for controlling the operations of the row driver 200, the ADC 400, the output buffer 500 and the column driver 600. The timing controller 700 may provide the row driver 200, the column driver 600, the ADC 400 and the output buffer 500 with the clock signal required for the operations of the respective components of the image sensing device, a control signal for timing control, and address signals for selecting a row or column. In an embodiment, the timing controller 700 may include a logic control circuit, a PLL (Phase Locked Loop) circuit, a timing control circuit, a communication interface circuit and the like.

Figure 2:
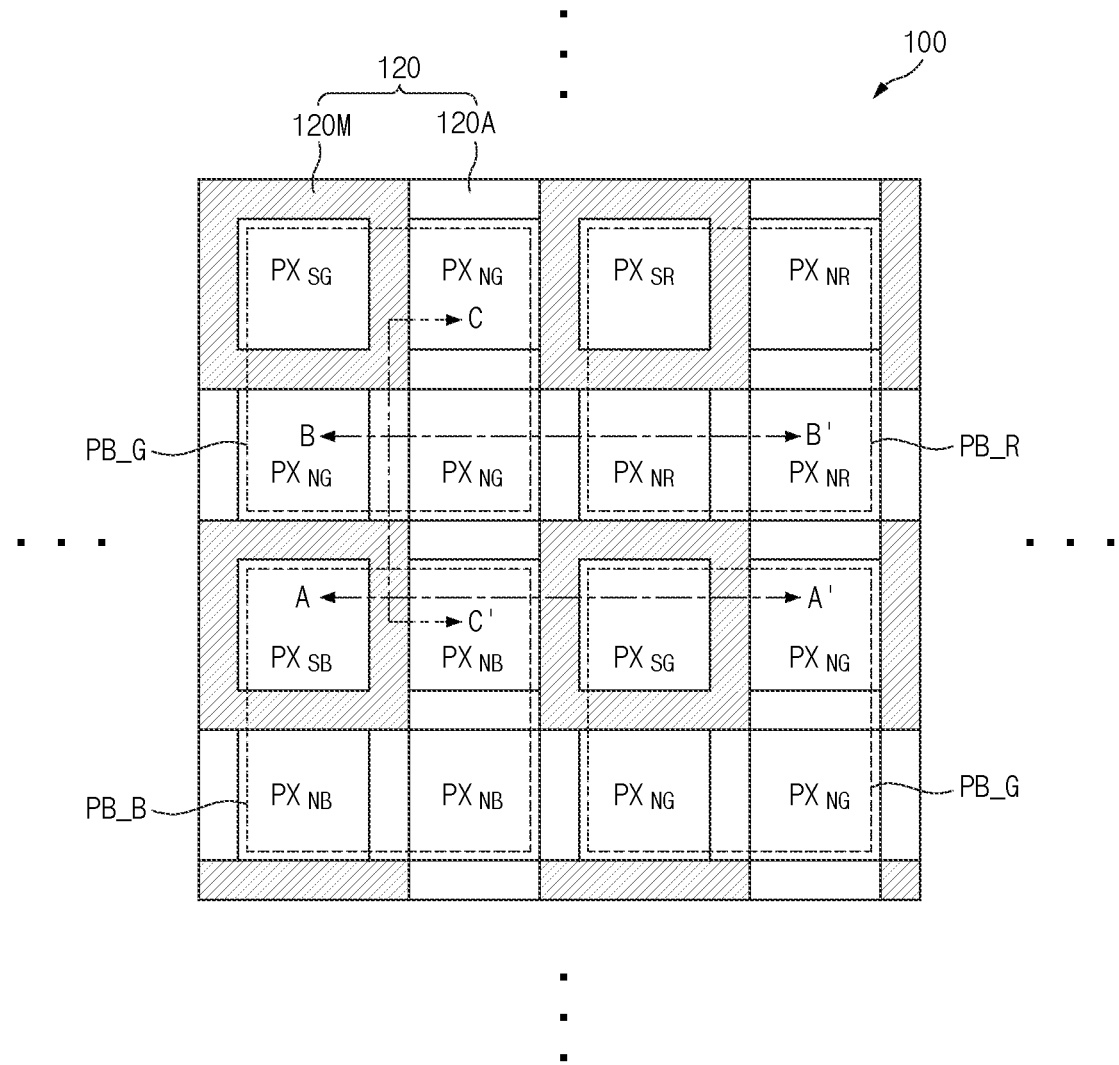
FIG. 2 is a diagram illustrating a portion of a pixel array in FIG. 1.

FIG. 2 is a diagram illustrating a portion of the pixel array in FIG. 1.

The pixel array 100 may include a plurality of sub pixel blocks PB_R, PB_G and PB_B. Each of the sub pixel blocks PB_R, PB_G and PB_B may include a plurality of unit pixels. Each unit pixel may include a semiconductor device (e.g., photodiode) that converts incident light into an electrical signal (pixel signal) corresponding to the incident light. Each of the sub pixel blocks PB_R, PB_G and PB_B may include a plurality of unit pixels having the same color filters arranged adjacent to each other in an N×N matrix where N is a natural number greater than or equal to 2. Such color filters are designed to capture color images and are structured to include color filters in different colors to properly capture color information of a scene or object to be imaged. One of suitable color filter arrangement is a Bayer color filter array of different color filters that include 50% of the total color filters to be green (G), 25% of the total color filters to be blue (B) and 25% of the total color filters to be red (R). In implementing a Bayer color filter array, two adjacent color filters in the same row or column may be in different colors, or, alternatively, in the same color. One particular implementation of a Bayer color filter array for placing adjacent color filters of the same color in a row or column is a Quad-Bayer pixel structure, in which adjacent 2×2 pixels of a 4-pixel block are of the same color as a basic building block while achieving the Bayer color arrangement by having 50% of the total 4-pixel color filter blocks to be green (G), 25% of the total 4-pixel color filter blocks to be blue (B) and 25% of the total 4-pixel color filter blocks to be red (R). For example, one example of such a Quad-Bayer pixel structure may include a 4×4 4-pixel block pattern of one 4-pixel block of blue color filters, one 4-pixel block of red color filters, and two 4-pixel blocks of green color filters.

FIG. 2 illustrates the sub pixel blocks PB_R, PB_G and PB_B each having a quad structure in which four unit-pixels having the same color filers are arranged in a 2×2 matrix. Although FIG. 2 illustrates only four sub pixel blocks PB_R, PB_G and PB_B, a plurality of the sub pixel blocks PB_R, PB_G and PB_B may be successively arranged in the row and column directions in the pixel array 100.

The sub pixel block PB_R may have a structure in which four red color pixels each including a red color filter are arranged in a 2×2 matrix. The red color filter allows light at a first wavelength band (e.g., red light) to be transmitted to the semiconductor device (e.g., photodiode). The sub pixel block PB_G may have a structure in which four green color pixels each including a green color filter are arranged in a 2×2 matrix. The green color filters allows light at a second wavelength band (e.g., green light) shorter than the first wavelength band to be transmitted to the semiconductor device (e.g., photodiode). The sub pixel block PB_B may have a structure in which four blue color pixels each including a blue color filter are arranged in a 2×2 matrix. The blue color filter allows light at a third wavelength band (e.g., blue light) shorter than the second wavelength band to be transmitted to the semiconductor device (e.g., photodiode).

Such red, green and blue sub pixel blocks PB_R, PB_G and PB_B may be successively arranged in a Bayer pattern.

In some implementations, a grid structure 120 may be formed between adjacent color filters of unit pixels $PX_{NR}$, $PX_{NG}$, $PX_{NB}$, $PX_{SR}$, $PX_{SG}$ and $PX_{SB}$ to prevent cross-talk between the adjacent color filters.

The sub pixel blocks PB_R, PB_G and PB_B may include one or more short exposure pixels $PX_{SR}$, $PX_{SG}$ and $PX_{SB}$, respectively, to implement an HDR (High Dynamic Range) mode. In some implementations, the quad structure can be used to implement two or more exposure modes within a group of four pixels, thus improving the image quality. In this patent document, the unit pixels other than the short exposure pixels $PX_{SR}$, $PX_{SG}$ and $PX_{SB}$ are referred to as normal pixels $PX_{NR}$, $PX_{NG}$ and $PX_{NB}$. The short exposure pixels $PX_{SR}$, $PX_{SG}$ and $PX_{SB}$ may be structured to receive a smaller amount of light by photoelectric conversion regions within a substrate, compared to the normal pixels $PX_{NR}$, $PX_{NG}$ and $PX_{NB}$ for the same exposure time. Therefore, the pixel array 100 may generate pixel signals (e.g., normal pixel signal and short exposure pixel signal) for different amounts of light only through one exposure.

In performing this operation, the grid structure 120 based on some embodiments of the disclosed technology may include a first grid 120M positioned between the color filter of the short exposure pixel $PX_{SR}$, $PX_{SG}$ or $PX_{SB}$ and the color filters of the normal pixels $PX_{NR}$, $PX_{NG}$ and $PX_{NB}$ and a second grid 120A positioned between the color filters of the respective normal pixels $PX_{NR}$, $PX_{NG}$ and $PX_{NB}$. The first grid 120M and the second grid 120A may have different structures. For example, in the grid structure 120, the first grid 120M may indicate a region positioned adjacent to the color filters of the short exposure pixels $PX_{SR}$, $PX_{SG}$ and $PX_{SB}$, and the second grid 120A may indicate a region which is not positioned adjacent to the color filters of the short exposure pixels $PX_{SR}$, $PX_{SG}$ and $PX_{SB}$, but positioned adjacent to only the color filters of the normal pixels $PX_{NR}$, $PX_{NG}$ and $PX_{NB}$.

The first grid 120M may include a light absorption layer. Here, the light absorption layer may include a metal layer. The metal layer may be formed in an annular shape to surround the color filters of the short exposure pixels $PX_{SR}$, $PX_{SG}$ and $PX_{SB}$. That is, the color filters of the short exposure pixels $PX_{SR}$, $PX_{SG}$ and $PX_{SB}$ may be surrounded by the metal layer.

The second grid 120A may include a light reflecting layer. Here, the light reflecting layer may include a low index material layer such as an air layer. For example, the second grid 120A may have a hybrid structure in which a metal layer and an air layer are stacked.

Therefore, in the short exposure pixels $PX_{SR}$, $PX_{SG}$ and $PX_{SB}$ surrounded by the metal layer absorbing light, a large amount of light may be absorbed by the metal layer of the first grid 120M instead of reaching the photoelectric conversion region. On the other hand, light rays incident on the normal pixels $PX_{NR}$, $PX_{NG}$ and $PX_{NB}$ may be reflected by the air layers and introduced into the photoelectric conversion regions of the normal pixels $PX_{NR}$, $PX_{NG}$ and $PX_{NB}$. Therefore, during the same exposure time, the amount of light absorbed by the photoelectric conversion regions of the short exposure pixels $PX_{SR}$, $PX_{SG}$ and $PX_{SB}$ may become smaller than the amount of light absorbed by the photoelectric conversion regions of the normal pixels $PX_{NR}$, $PX_{NG}$ and $PX_{NB}$.

In an implementation, the first grid 120M may include the metal layer as the light absorption layer. In another implementation, the first grid 120M may include another material layer that can absorb light other than the metal layer. Furthermore, In an implementation, the second grid 120A may include the air layer as the light reflecting layer. In another implementation, the second grid 120A may include another material layer that can reflect light other than the air layer.

Figure 3:
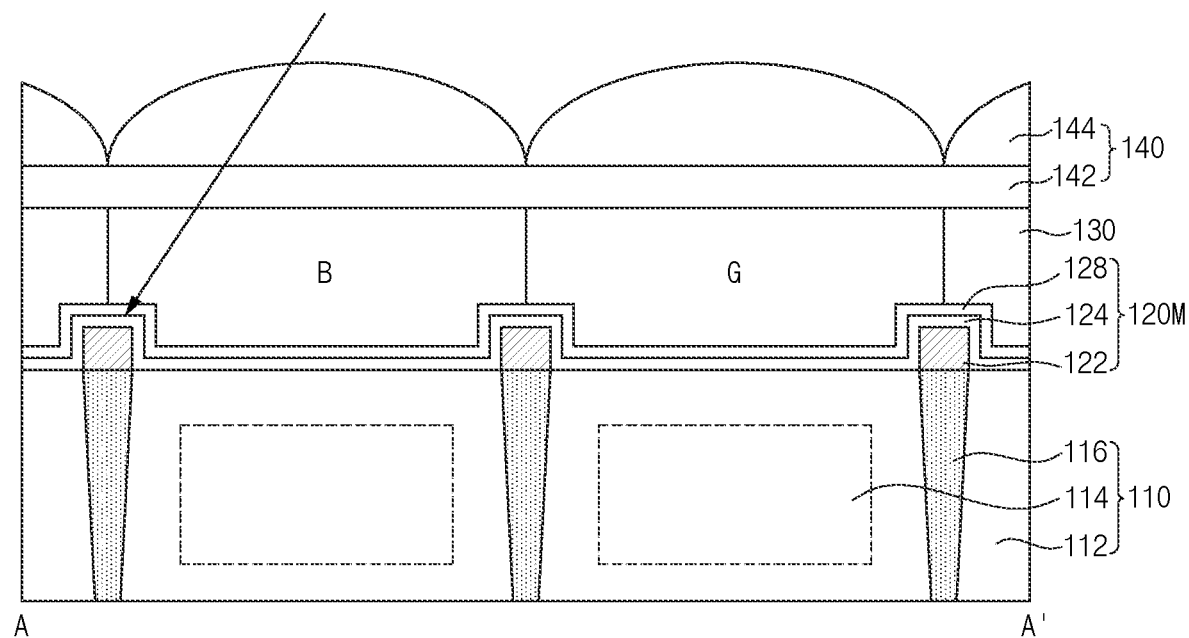
FIG. 3 is a diagram illustrating an example cross-section of the pixel array of FIG. 2, taken along line A-A'.
Figure 4:
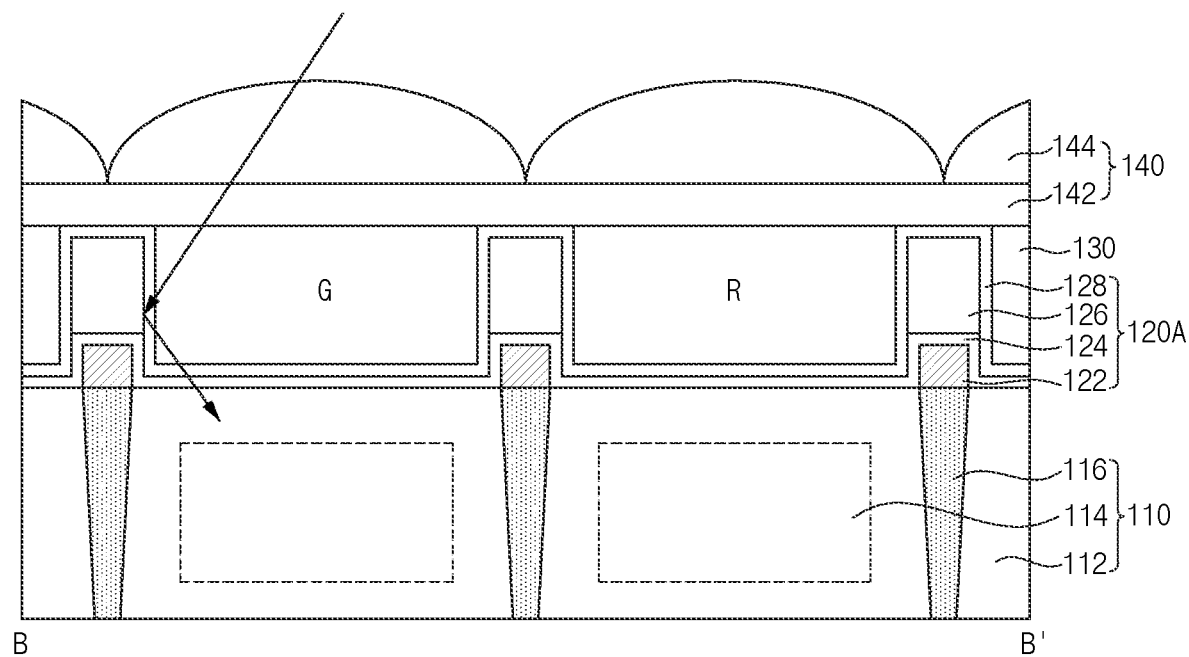
FIG. 4 is a diagram illustrating an example cross-section of the pixel array of FIG. 2, taken along line B-B'.
Figure 5:
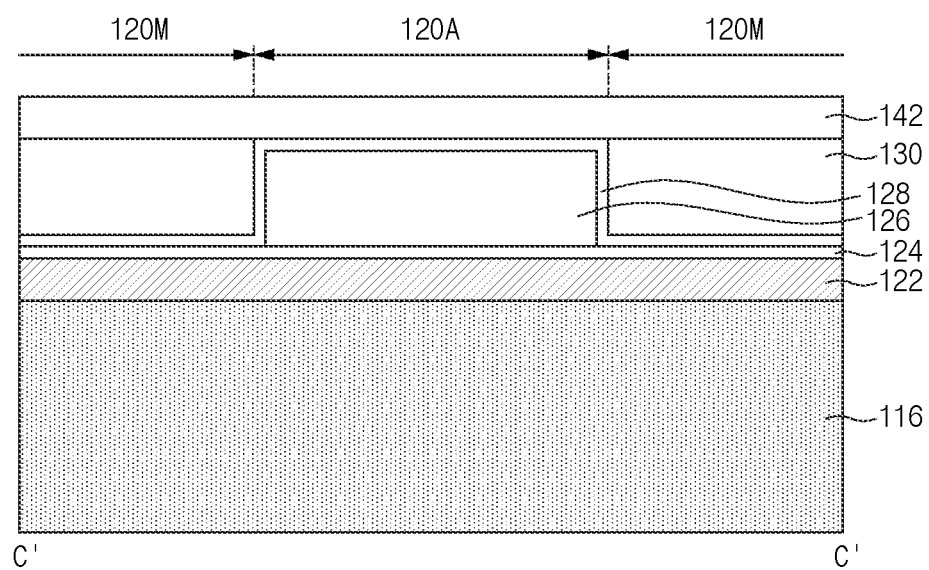
FIG. 5 is a diagram illustrating an example cross-section of the pixel array of FIG. 2, taken along line C-C'.

FIG. 3 is a diagram illustrating an example of a cross-section of the pixel array of FIG. 2, taken along line A-A', FIG. 4 is a diagram illustrating an example of a cross-section of the pixel array of FIG. 2, taken along line B-B', and FIG. 5 is a diagram illustrating an example of a cross-section of the pixel array of FIG. 2, taken along line C-C'.

Referring to FIGS. 3 to 5, the pixel array 100 may include a substrate layer 110, grid structures 120M and 120A, a color filter layer 130 and a lens layer 140.

The substrate layer 110 may include a substrate 112, photoelectric conversion regions 114 and isolation structures 116. The substrate layer 110 may include a first surface and a second surface which are positioned on the opposite sides thereof. Here, the first surface may indicate a surface on which light is incident from the outside.

The substrate 112 may include a semiconductor substrate including single-crystal silicon. The substrate 112 may include P-type impurities.

The photoelectric conversion regions 114 may be formed in the semiconductor substrate 112 and correspond to the respective unit pixels. The photoelectric conversion regions 114 may generate photocharge by converting visible light that is filtered by the color filter layer 130. The photoelectric conversion regions 114 may include N-type impurities.

The isolation structure 116 may be formed between the photoelectric conversion regions 114 of the adjacent unit pixels to isolate the photoelectric conversion regions 114 from each other. The isolation structure 116 may include a trench structure such as BDTI (Back Deep Trench Isolation) or FDTI (Front Deep Trench Isolation). Alternatively, the isolation structure 116 may include a junction isolation structure formed by implanting high-concentration impurities (for example, P-type impurities) into the substrate 112.

The grid structure 120 may be positioned between color filters R, G and B to prevent cross-talk between the adjacent color filters R, G and B. The grid structure 120 may be formed over the first surface of the substrate layer 110. The grid structure 120 may overlap the isolation structure 116 in a vertical direction. The grid structure 120 may include a first grid 120M and a second grid 120A.

The first grid 120M may include a metal layer 122, a first capping layer 124 and a second capping layer 128, and the second grid 120A may include the metal layer 122, the first capping layer 124, an air layer 126 and the second capping layer 128.

The metal layer 122 may include tungsten, and both of the first and second grids 120M and 120A may include the metal layer 122. The metal layer 122 may include a barrier metal layer (not illustrated) positioned under the tungsten.

The air layer 126 may be formed over the first capping layer 124, and may overlap the metal layer 122 in the second grid 120A. That is, the second grid 120A may include a hybrid structure in which the metal layer 122 and the air layer 126 are stacked.

In an embodiment, the air layer 126 may be formed over the metal layer 122 in the second grid 120A, while no air layer is formed over the metal layer 122 in the first grid 120M. In this case, as illustrated in FIG. 3, light colliding with the first grid 120M among incident light rays may be absorbed by the metal layer 122. As illustrated in FIG. 4, however, light colliding with the second grid 120A among the incident light rays may be reflected by the air layer 126 and introduced into the photoelectric conversion region 114. Therefore, during the same exposure time, the amount of light introduced into the photoelectric conversion regions 114 of the short exposure pixels $PX_{SR}$, $PX_{SG}$ and $PX_{SB}$ whose four surfaces are all surrounded by the first grid 120M as illustrated in FIG. 2 may become smaller than the amount of light introduced into the photoelectric conversion regions 114 of the normal pixels $PX_{NR}$, $PX_{NG}$ and $PX_{NB}$.

Furthermore, the height of the metal layer 122 may be adjusted to control the amount of light introduced into the photoelectric conversion regions 114 of the short exposure pixels $PX_{SR}$, $PX_{SG}$ and $PX_{SB}$.

The first capping layer 124 may be made of nitride, and extended to the bottom of the color filter layer 130 while covering the metal layer 122. The first capping layer 124 may prevent the expansion of the metal layer 122 during a heat treatment process. A region formed under the color filter layer 130 in the first capping layer 124 may be used as a part of an anti-reflection layer.

The second capping layer 128 which is a material layer formed at the outermost part of the grid structure 120 may define a region where the air layer 126 is formed in the second grid 120A, and overlap the first capping layer 124 in the first grid 120M. The second capping layer 128 may be made of oxide, and extended to the bottom of the color filter layer 130 while covering the air layer 126. The oxide may include ULTO (Ultra Low Temperature Oxide) such as silicon oxide ($SiO_2$). A region formed under the color filter layer 130 in the second capping layer 128 may be used as a part of the anti-reflection layer.

In the first and second capping layers 124 and 128, the region formed under the color filter layer 130 may function as an anti-reflection layer which compensates for a difference in refractive index between the color filter layer 130 and the substrate 112 such that light passing through the color filter layer 130 can be effectively incident on the substrate 112. Therefore, in an embodiment, a separate anti-reflection layer may not be provided between the color filter layer 130 and the substrate 112.

The color filter layer 130 may include color filters R, G and B which filter visible light from the light incident through the lens layer 140, and transfer the filtered light to the corresponding photoelectric conversion regions 114. For example, the color filter layer 130 may include a plurality of red color filters R configured to pass red visible light in the first wavelength band, a plurality of green color filters G configured to pass green visible light in the second wavelength band shorter than the first wavelength band, and a plurality of blue color filters B configured to pass blue visible light in the third wavelength band shorter than the second wavelength band. The color filter layer 130 may be formed in the region defined by the first and second grids 120M and 120A over the substrate layer 110.

The lens layer 140 may include an over coating layer 142 and micro lenses 144. The over coating layer 142 may be formed over the color filter layer 130. The over coating layer 142 may serve as a planarized layer for compensating for a level difference which may occur due to the color filter layer 130. The micro lenses 144 may be formed over the over coating layer 142. The micro lenses 144 may be formed in a hemispherical shape, and formed in the respective unit pixels. The micro lenses 144 may concentrate incident light, and transfer the concentrated light to the corresponding color filters R, G and B. The over coating layer 142 and the micro lenses 144 may be formed of the same material.

FIGS. 6A to 9A are cross-sectional views illustrating fabrication processes of the first grid of FIG. 3, and FIGS. 6B to 9B are cross-sectional views illustrating fabrication processes of the second grid of FIG. 4.

Figure 6A:
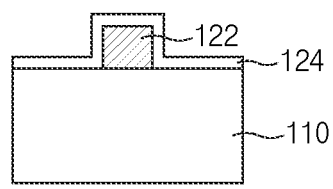
FIG. 6A illustrates an example of a fabrication process of a first grid of FIG. 3.
Figure 6B:
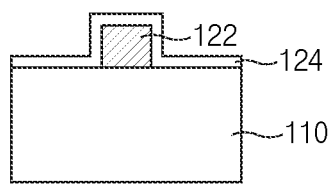
FIG. 6B illustrates an example of a fabrication process of a second grid of FIG. 4.

Referring to FIGS. 6A and 6B, a metal layer 122 is formed over a substrate layer 110 including photoelectric conversion regions and isolation structures.

For example, the metal layer 122 may be formed through a process of forming a metal over the entire surface of the substrate layer 110, and etching the metal using a mask pattern (not illustrated) as an etch mask, the mask pattern defining a grid structure region. Here, the metal may include tungsten.

Then, a first capping layer 124 may be formed over the substrate layer 110 and the metal layer 122. Here, the first capping layer 124 may include nitride.

Figure 7A:
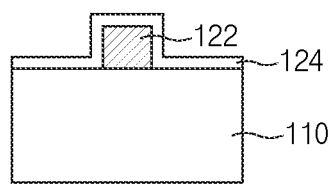
FIG. 7A illustrates an example of a fabrication process of a first grid of FIG. 3.
Figure 7B:
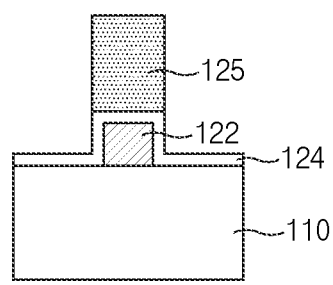
FIG. 7B illustrates an example of a fabrication process of a second grid of FIG. 4.

Referring to FIGS. 7A and 7B, a sacrificial layer pattern 125 formed in a region where a second grid 120A is to be formed over the first capping layer 124.

For example, a sacrificial layer (not illustrated) may be formed over the entire surface of the first capping layer 124, and then a mask pattern (not illustrated) may be formed over the sacrificial layer so as to define the second grid 120A. Here, the sacrificial layer may include SOC including carbon. Then, by etching the sacrificial layer using the mask pattern as an etch mask, the sacrificial layer pattern 125 may be formed in the region of the second grid 120A.

Figure 8A:
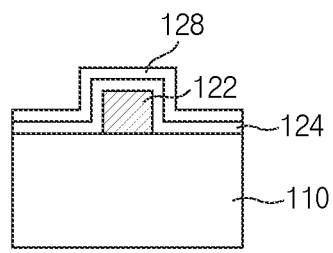
FIG. 8A illustrates an example of a fabrication process of a first grid of FIG. 3.
Figure 8B:
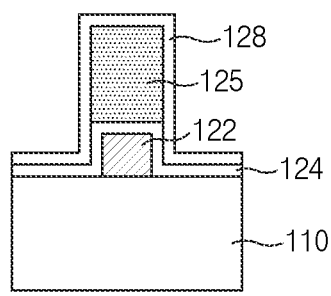
FIG. 8B illustrates an example of a fabrication process of a second grid of FIG. 4.

Referring to FIGS. 8A and 8B, a second capping layer 128 may be formed over the first capping layer 124 and the sacrificial layer pattern 125.

Here, the second capping layer 128 may include ULTO. The second capping layer 128 may be formed to such a thickness that molecules generated by combination of gas used in a subsequent plasma process and carbon of the sacrificial layer pattern 125 can easily escape to the outside.

Figure 9A:
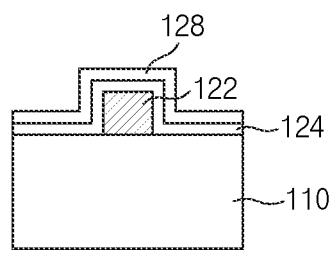
FIG. 9A illustrates an example of a fabrication process of a first grid of FIG. 3.
Figure 9B:
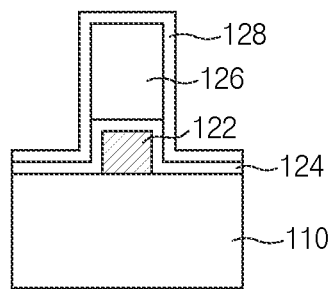
FIG. 9B illustrates an example of a fabrication process of a second grid of FIG. 4.

Referring to FIGS. 9A and 9B, a plasma process may be performed on the resultant structure of FIGS. 8A and 8B so as to remove the sacrificial layer pattern 125, and an air layer 126 may be formed at the position from which the sacrificial layer pattern 125 is removed. Here, the plasma process may include a plasma process using gas such as $O_2$, $N_2$, $H_2$, CO, $CO_2$ or $CH_4$, which contains one or more of oxygen, nitrogen and hydrogen.

For example, when an $O_2$ plasma process is performed on the resultant structure of FIG. 9B, oxygen radicals O* may be introduced into the sacrificial layer pattern 125 through the second capping layer 128, and combined with carbon of the sacrificial layer pattern 125, thereby generating CO or $CO_2$. The generated CO or $CO_2$ escapes to the outside through the second capping layer 128.

Through such a process, the sacrificial layer pattern 125 may be removed, and the air layer 126 may be formed at the position from which the sacrificial layer pattern 125 is removed.

Then, a color filter layer 130 may be formed over the second capping layer 128 such that the regions defined by the first and second grids 120M and 120A are buried therein, and a lens layer 140 may be formed over the color filter layer 130.

Figure 10:
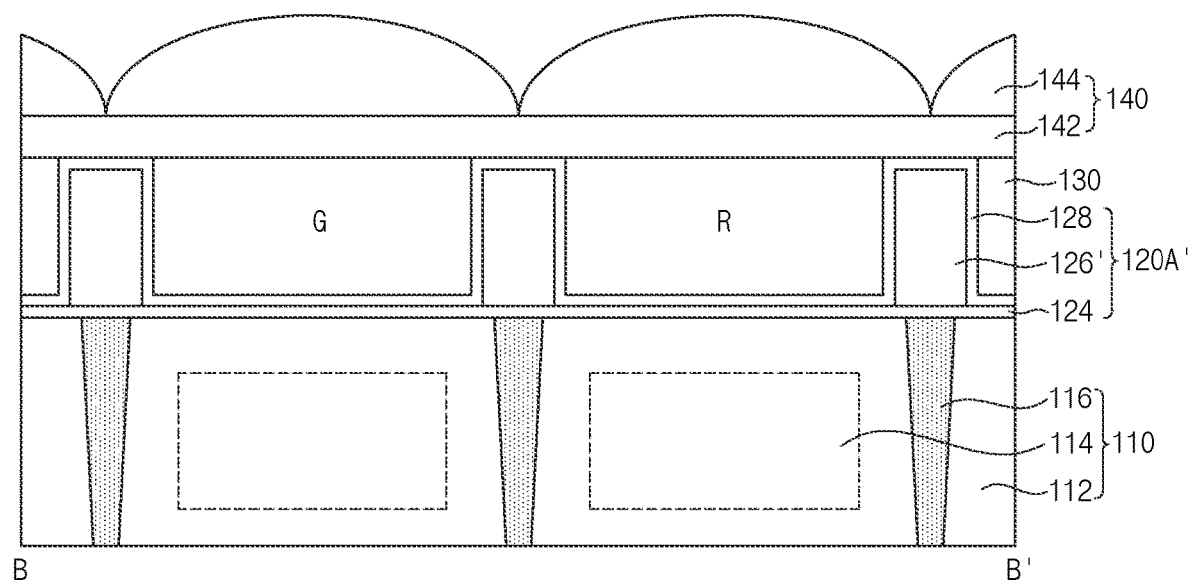
FIG. 10 illustrates another example of the cross section of the pixel array of FIG. 2, taken along line B-B'.
Figure 11:
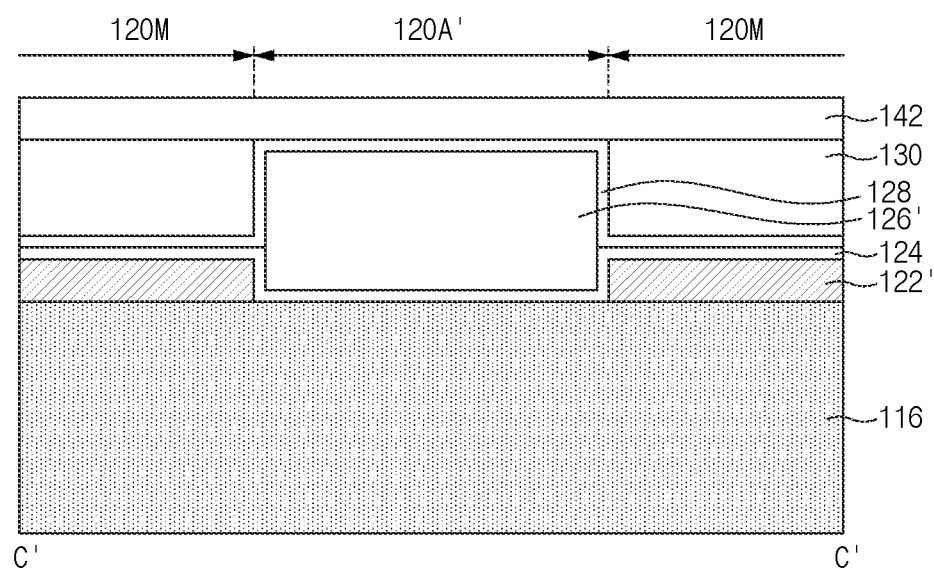
FIG. 11 illustrates another example of the cross section of the pixel array of FIG. 2, taken along line C-C'.

FIGS. 10 and 11 illustrates other examples of the cross sections of the pixel array of FIG. 2, taken along lines B-B' and C-C'.

Referring to FIGS. 10 and 11, a second grid 120A' may include a first capping layer 124, an air layer 126' and a second capping layer 128.

That is, in the above-described embodiment, the metal layer 122 formed in the first grid 120M is extended to the region where the second grid 120A is formed. In an embodiment, however, a metal layer 122' may be formed only in a first grid 120M, not in the second grid 120A'.

Even here, the height of the metal layer 122' formed in the first grid 120M may be adjusted to control the amount of light introduced into photoelectric conversion regions 114 of the short exposure pixels $PX_{SR}$, $PX_{SG}$ and $PX_{SB}$.

While various embodiments have been described above, it will be understood to those skilled in the art that the embodiments described are examples only. Accordingly, the image sensing device described herein should not be limited based on the described embodiments.

What is claimed is:

1. An image sensing device comprising:
   one or more first unit pixels, each first unit pixel structured to generate a pixel signal by converting filtered light incident through a first color filter;
   a plurality of second unit pixels positioned adjacent to the one or more first unit pixels, each second unit pixel structured to generate a pixel signal by converting filtered light incident through a second color filter;
   a first grid including a light absorption layer positioned between the first and second color filters and a first capping layer covering the light absorption layer; and
   a second grid including an air layer positioned between adjacent second color filters and a second capping layer covering the air layer,
   wherein the second capping layer extends to bottoms of the first and second color filters.

2. The image sensing device of claim 1, wherein the first grid is formed in an annular shape to surround the first color filter.

3. The image sensing device of claim 1, wherein the second grid is positioned adjacent to the second color filter and spaced apart from the first color filter.

4. The image sensing device of claim 1, wherein the first grid extends to a region where the second grid is formed.

5. The image sensing device of claim 4, wherein the second grid comprises:
   the light absorption layer;
   the first capping layer structured to cover the light absorption layer;
   the air layer positioned over the first capping layer to overlap the light absorption layer.

6. The image sensing device of claim 1, wherein the second grid comprises:
   the first capping layer extending from the first grid and non-overlapping with the light absorption layer;
   the air layer formed over the first capping layer.

7. The image sensing device of claim 1, wherein the light absorption layer comprises a metal layer.

8. The image sensing device of claim 1, wherein the first and second color filters are of the same color.

9. The image sensing device of claim 8, wherein the first unit pixel and the second unit pixels are arranged adjacent to each other in a 2×2 matrix array.

10. An image sensing device comprising:
    a plurality of color filters arranged in rows and columns; and
    a grid structure positioned between adjacent color filters,
    wherein the plurality of color filters include one or more first color filters and one or more second color filters,
    wherein the grid structure includes a first grid including a light absorption layer positioned adjacent to the one or more first color filters, and a second grid including an air layer positioned spaced apart from the first color filter and adjacent to the one or more second color filters,
    wherein the first grid further includes a first capping layer covering the light absorption layer and the second grid further includes a second capping layer covering the air layer, and
    wherein the second capping layer extends to bottoms of the plurality of color filters.

11. The image sensing device of claim 10, wherein the color filters are arranged adjacent to each other in a 2×2 matrix array.

12. The image sensing device of claim 10, wherein the first grid is formed in an annular shape to surround the first color filter.

13. The image sensing device of claim 10, wherein the first grid extends to a region where the second grid is formed.

14. The image sensing device of claim 13, wherein the second grid further comprises:
    the light absorption layer;
    the first capping layer structured to cover the light absorption layer; and
    the air layer disposed over the first capping layer to overlap the light absorption layer.

15. The image sensing device of claim 10, wherein the second grid further comprises:
    the first capping layer extending from the first grid and non-overlapping with the light absorption layer; and
    the air layer disposed over the first capping layer.

16. The image sensing device of claim 11, wherein the light absorption layer comprises a metal layer.

17. The image sensing device of claim 1, wherein the first grid further includes the second capping layer extending from the second grid through the bottoms of the first and second color filters.

18. The image sensing device of claim 10, wherein the first grid further includes the second capping layer extending from the second grid through the bottoms of the plurality of color filters.

* * * * *